United States Patent
Takanishi et al.

(10) Patent No.: US 8,900,914 B2
(45) Date of Patent: Dec. 2, 2014

(54) TFT SUBSTRATE AND METHOD FOR MANUFACTURING SAME

(75) Inventors: Yudai Takanishi, Osaka (JP); Masao Moriguchi, Osaka (JP); Yohsuke Kanzaki, Osaka (JP); Takatsugu Kusumi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/124,178

(22) PCT Filed: May 29, 2012

(86) PCT No.: PCT/JP2012/063771
§ 371 (c)(1),
(2), (4) Date: Dec. 6, 2013

(87) PCT Pub. No.: WO2012/169388
PCT Pub. Date: Dec. 13, 2012

(65) Prior Publication Data
US 2014/0103342 A1    Apr. 17, 2014

(30) Foreign Application Priority Data

Jun. 6, 2011   (JP) ................................. 2011-126196

(51) Int. Cl.
*H01L 29/10* (2006.01)
*H01L 29/786* (2006.01)
*H01L 27/12* (2006.01)
*H01L 29/66* (2006.01)

(52) U.S. Cl.
CPC ...... *H01L 29/78606* (2013.01); *H01L 27/1225* (2013.01); *H01L 29/66742* (2013.01); *H01L 29/7869* (2013.01); *H01L 29/66969* (2013.01)

USPC ............................................... 438/85; 257/43

(58) Field of Classification Search
USPC ............................................... 257/43; 438/85
See application file for complete search history.

(56) References Cited

U.S. PATENT DOCUMENTS

| | | | |
|---|---|---|---|
| 2009/0140243 A1* | 6/2009 | Kim et al. ...................... | 257/43 |
| 2010/0140614 A1 | 6/2010 | Uchiyama et al. | |
| 2010/0155719 A1* | 6/2010 | Sakata et al. .................... | 257/43 |
| 2010/0244031 A1* | 9/2010 | Akimoto et al. ................ | 257/57 |
| 2010/0252826 A1* | 10/2010 | Yamazaki et al. .............. | 257/43 |

FOREIGN PATENT DOCUMENTS

| | | |
|---|---|---|
| JP | 2010-062229 A | 3/2010 |
| JP | 2010-140919 A | 6/2010 |

* cited by examiner

*Primary Examiner* — Jami M Valentine
(74) *Attorney, Agent, or Firm* — Chen Yoshimura LLP

(57) ABSTRACT

A method of manufacturing a TFT substrate includes: forming a gate electrode (12) and a gate insulating film (30) on a substrate (8); forming a source electrode (14) and a drain electrode (15) at a gap from each other on the gate insulating film (30), and forming a drain connection part (16); forming, after the step of forming the source electrode and the drain electrode, an oxide semiconductor layer (18, 18a, 18b) that contains a channel portion connecting the source electrode (14) to the drain electrode (15) and that contains an additional portion (18a) covering the drain connection part (16); oxidizing a surface of the oxide semiconductor layer (18, 18a, 18b); forming a contact hole (22) in an insulating film (32) that covers the oxide semiconductor layer; removing a portion of the additional portion (18a) of the oxide semiconductor layer that is located inside the contact hole (22); and forming a conductive layer (20) that electrically connects the drain connection part (16) that has been exposed.

9 Claims, 7 Drawing Sheets

(a)

(b)

(c)

(d)

(e)

(f)

(a)

(b)

(c)

(d)

(a)

(b)

(a)

(a')

(b)

(b')

(c)

(c')

(a)

(b)

TFT SUBSTRATE AND METHOD FOR MANUFACTURING SAME

TECHNICAL FIELD

The present invention relates to a TFT substrate made using an oxide semiconductor and a method of manufacturing this TFT substrate.

BACKGROUND ART

An active matrix substrate used in liquid crystal display devices and the like has a switching element such as a thin-film transistor (hereinafter, "TFT") in each pixel. Conventionally, a TFT with an amorphous silicon film as an active layer (hereinafter, "amorphous silicon TFT") or a TFT with a polycrystalline silicon film as an active layer (hereinafter, "polycrystalline silicon TFT") has been widely used as such a switching element.

There have been recent attempts to use materials other than amorphous silicon and polycrystalline silicon for the active layer of the TFT. A liquid crystal display device is disclosed in Patent Document 1 that uses an oxide semiconductor film such as InGaZnO (an oxide made of indium, gallium, and zinc; hereinafter, "IGZO") to form the active layer of the TFT, for example. Such a TFT is called an "oxide semiconductor TFT."

It is possible to operate the oxide semiconductor TFT at higher speeds than the amorphous silicon TFT. Furthermore, the oxide semiconductor film is formed with a process that is simpler than for the polycrystalline silicon film, and thus, the oxide semiconductor film can be applied to devices requiring a large area. Therefore, it is expected that the oxide semiconductor TFT will be used in emerging liquid crystal display devices that perform quadruple speed driving and 3D display as an active element that can perform high efficiency switching operation and that can be manufactured while suppressing the number of manufacturing steps and cost.

The electron mobility of the oxide semiconductor is also high, and thus, even if the size thereof is reduced, it is possible to have the same or better performance compared to a conventional amorphous silicon TFT. Thus, if using the oxide semiconductor TFT, the amount of area the TFT occupies in the pixel area of the liquid crystal display device or the like can be reduced, and as a result, the pixel aperture ratio can be improved. Accordingly, it is possible to have a brighter display and to achieve a reduction in power consumption due to the amount of light from the backlight being reduced. In particular, it is not easy to increase the pixel aperture ratio through minimum-width limitations for the wires (process rules) or the like in small-sized/high resolution display devices used in smartphones and the like. This is why the adoption of oxide semiconductor TFTs is expected.

When using an oxide semiconductor film, however, there is a risk that oxygen defects will create electron carriers in the TFT manufacturing process, such as in a heat treatment step, for example, causing a reduced resistance. In TFTs with a top-contact structure, the oxide semiconductor film at the bottom thereof is susceptible to damage during the etching step of the source and drain electrode and the formation step of the interlayer insulating film.

Thus, there are cases in which it has been difficult to achieve stable TFT characteristics when using an oxide semiconductor film as an active layer of the TFT. A top-contact structure refers to a structure in which the top of the semiconductor film, which functions as the channel, is connected to the source electrode and drain electrode. Normally, this structure is obtained by forming an island-like semiconductor layer and then forming a source/drain metal layer on the semiconductor layer.

A technology is disclosed in Patent Document 1 in which the OFF current of the TFT is reduced by conducting an oxidation treatment (an oxygen radical treatment using oxygen plasma) on a channel region of an oxide semiconductor TFT having this top-contact structure. This treatment increases oxygen concentration on the surface (sometimes called the back channel section) of the channel region that is opposite to the gate electrode, and forms an oxygen excessive region. This results in being able to increase the resistance of the back channel section and being able to reduce the OFF current in n-type oxide semiconductor TFTs made of IGZO.

RELATED ART DOCUMENTS

Patent Documents

Patent Document 1: Japanese Patent Application Laid-Open Publication No. 2010-062229
Patent Document 2: Japanese Patent Application Laid-Open Publication No. 2010-140919

SUMMARY OF THE INVENTION

Problems to be Solved by the Invention

The oxide semiconductor TFT disclosed in Patent Document 1, however, has a top-contact structure, and thus, there is a possibility that the channel region will be damaged in the step of forming the source electrode and drain electrode, which is performed after providing the oxide semiconductor layer as described above.

Meanwhile, TFTs with a bottom-contact structure are known, such as the technology disclosed in FIG. 10(c) of Patent Document 2, for example. A bottom-contact structure is a structure in which the bottom of the semiconductor film, which forms the channel, is connected to the source electrode and drain electrode. In an oxide semiconductor TFT with such a bottom-contact structure, the source electrode and drain electrode are formed, and then the channel region made of the oxide semiconductor layer is formed to straddle the source electrode and drain electrode. Accordingly, there is no problem with channel damage as is possible in the top-contact TFT structure described above.

In an oxide semiconductor TFT with a bottom-contact structure, however, the inventors of the present invention have found that problems can occur, as described below, when a step of oxidizing the back channel section is conducted as disclosed in Patent Document 1.

When manufacturing a bottom-contact structure TFT, an oxide semiconductor layer is formed on the gate insulating film after the source electrode and drain electrode have been formed at a gap from each other. This oxide semiconductor layer is typically formed in an island-shape between the source electrode and drain electrode in order to connect these. When oxidation treatment is performed on this oxide semiconductor layer, a portion of the source electrode and drain electrode, an extended part of the drain electrode and source wiring line (sometimes referred to as a drain connection part below), and the like are exposed on the substrate. As a result, a metal oxide film is formed on the surface of the source wiring line and drain connection part in the step of oxidizing, and the electrical resistance of the surface increases.

This results in being able to have a connection with the pixel electrode on the oxidized metal film when connecting the pixel electrode to the drain connection part in a liquid crystal display device and the like, for example. As such, contact is made while resistance has increased, posing a risk that the stability of the connection between the drain connection part and the pixel electrode will decrease and that display quality will be reduced.

The present invention was made in view of the above-mentioned problems, and aims at providing a TFT substrate having an oxide semiconductor TFT with improved device characteristics and a method of manufacturing the same.

Means for Solving the Problems

A method of manufacturing a TFT substrate according to one embodiment of the present invention includes: preparing a substrate; forming a gate electrode and a gate insulating film that covers the gate electrode on the substrate; forming a source electrode and a drain electrode at a gap from each other on the gate insulating film such that the source electrode and the drain electrode face each other above the gate electrode, and forming a drain connection part that connects to the drain electrode; forming, after the step of forming the source electrode and the drain electrode, an oxide semiconductor layer that contains a channel portion connecting the source electrode to the drain electrode and that contains an additional portion covering the drain connection part; oxidizing a surface of the oxide semiconductor layer; forming an insulating film that covers the surface of the oxide semiconductor layer that has been oxidized; forming a contact hole in the insulating film at a region corresponding to the additional portion of the oxide semiconductor layer; removing a portion of the additional portion of the oxide semiconductor layer that is located inside the contact hole; and forming a conductive film that electrically connects to the drain connection part via the contact hole, the drain connection part being exposed by removal of the additional portion.

One aspect of the present invention further includes: removing, after the step of oxidizing, a second additional portion that covers a source wiring line formed at the same time as the source electrode, the second additional portion being contained in the oxide semiconductor layer; forming a conductive film that electrically connects the source wiring to the gate wiring line that is formed at the same time as the gate electrode, the source wiring line being exposed by removal of the second additional portion.

In one aspect of the present invention, in the step of forming the contact hole, at least a portion of an edge of the additional portion of the oxide semiconductor layer is exposed in a bottom of the contact hole.

In one aspect of the present invention, in the step of forming the contact hole, an entire outer edge of the additional portion of the oxide semiconductor layer is exposed in the bottom of the contact hole.

In one aspect of the present invention, both the drain connection part that is oxidized in the step of oxidizing and the drain connection part that is not oxidized in the step of oxidizing are exposed in the contact hole by the step of removing the portion that is located inside the contact hole of the additional portion of the oxide semiconductor layer.

A TFT substrate according to one embodiment of the present invention has: a substrate; a gate electrode provided on the substrate; a gate insulating film that covers the gate electrode; a source electrode and a drain electrode provided at a gap from each other on the gate insulating film such that the source electrode and the drain electrode face each other above the gate electrode; an oxide semiconductor layer that is provided so as to cover the gap between the source electrode and the drain electrode and that has a bottom that connects to the source electrode and the drain electrode, a surface of the oxide semiconductor layer being oxidized; a drain connection part connected to the drain electrode; a gate insulating film arranged above the drain connection part, the gate insulting film having a contact hole; and a conductive layer connected to the drain connection part via the contact hole, wherein a surface in contact with the conductive film of the drain connection part has an oxidized region and non-oxidized region inside the contact hole.

In one aspect of the present invention, an additional portion of the oxide semiconductor layer having the surface that is oxidized is formed so as to cover the drain connection part in an area around the contact hole.

In one aspect of the present invention, the oxidized region is formed so as to surround the non-oxidized region in the contact hole.

A method of manufacturing a TFT substrate according to the present invention includes: preparing a substrate; forming a gate electrode and a gate insulating film that covers the gate electrode on the substrate; forming a source electrode and a drain electrode at a gap from each other on the gate insulating film such that the source electrode and the drain electrode face each other above the gate electrode; forming, in the step of forming the source electrode and drain electrode and at the same time, a first conductive layer at a location that is different from the source electrode and the drain electrode; forming, after the step of forming the source electrode and the drain electrode, an oxide semiconductor layer that contains a channel portion connecting the source electrode to the drain electrode and that contains an additional portion covering the first conductive layer; oxidizing a surface of the oxide semiconductor layer; removing at least a portion of the oxide semiconductor layer on the additional portion; and forming a second conductive film that connects with the first conductive film, the first conductive film being exposed by removal of the oxide semiconductor layer of the additional portion.

Effects of the Invention

According to one embodiment of the present invention, in a TFT using a oxide semiconductor for a channel, off-leakage current can be reduced by forming an oxygen excessive region on the back channel side, and a reduction in reliability of the connection due to unnecessary metal oxide layers being formed in other regions can be prevented. Display quality can be improved by using the TFT substrate made in this way with a liquid crystal display device or the like.

BRIEF DESCRIPTION OF THE DRAWINGS

4. FIGS. 5(a) to 5(c) are plan views each showing different steps, and FIGS. 5(a') to 5(c') are cross-sections of FIGS. 5(a) to 5(c).

DETAILED DESCRIPTION OF EMBODIMENT

Below, one embodiment of a TFT substrate of the present invention will be explained with reference to figures. The present invention, however, is not limited to the embodiment below.

Figure 1:
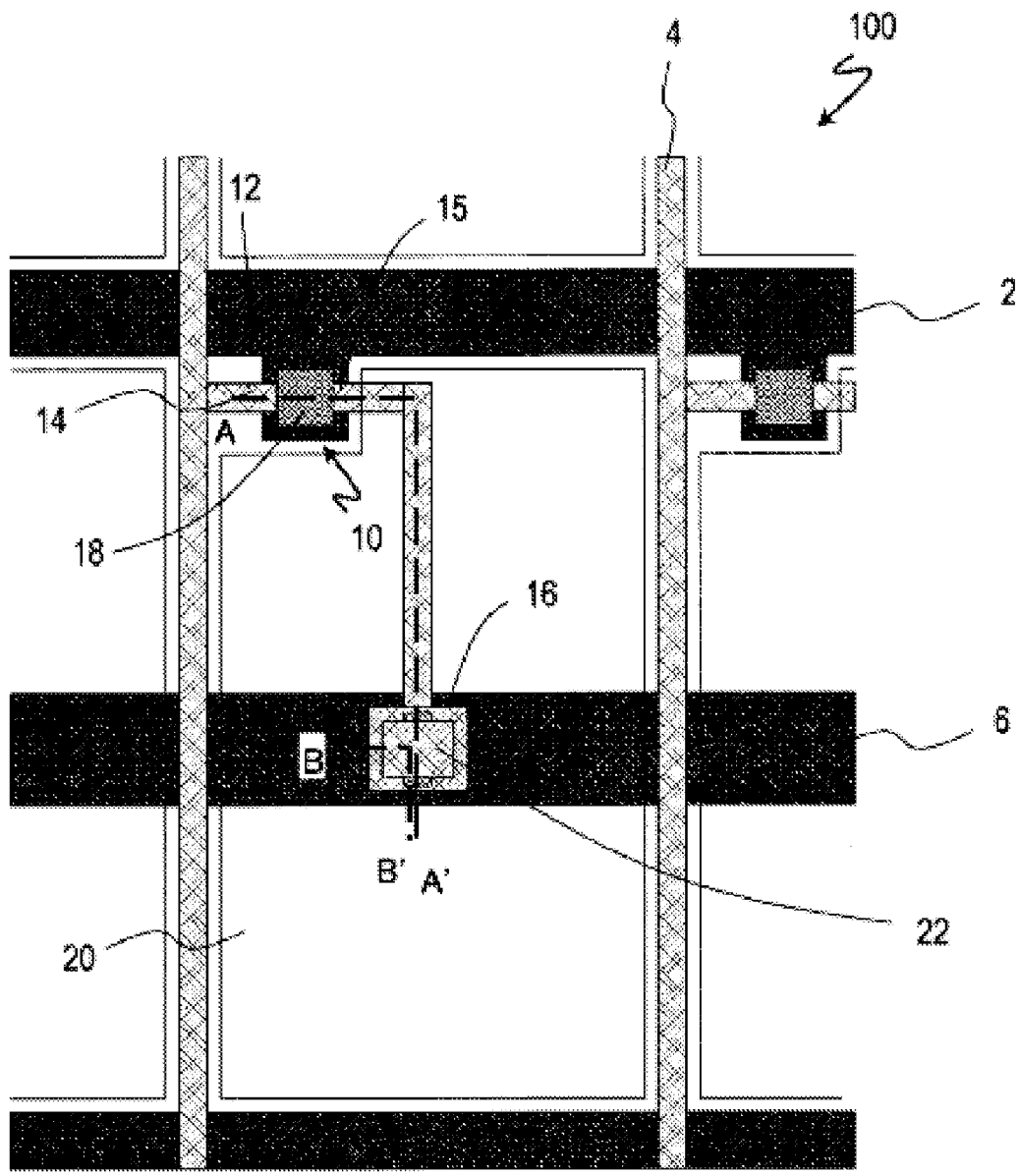
FIG. 1 is a plan view showing a configuration of a TFT substrate 100 according to one embodiment of the present invention.

FIG. 1 is a plan view showing a configuration of a TFT substrate 100 according to one embodiment of the present invention. FIGS. 2(a) to 2(f) and FIGS. 3(a) to 3(d) are cross-sectional views explaining a manufacturing process, in order, of the TFT substrate 100.

Figure 2:
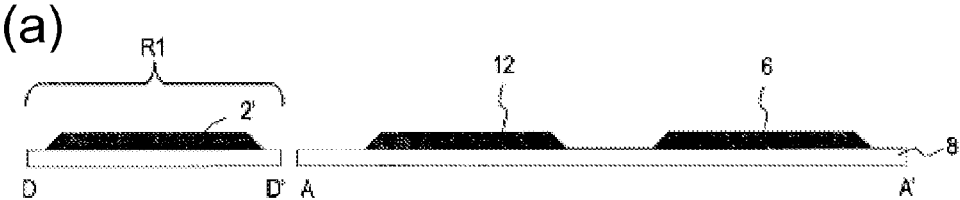
FIGS. 2(a) to 2(f) are cross-sectional views for explaining steps of manufacturing the TFT substrate 100.
Figure 2:
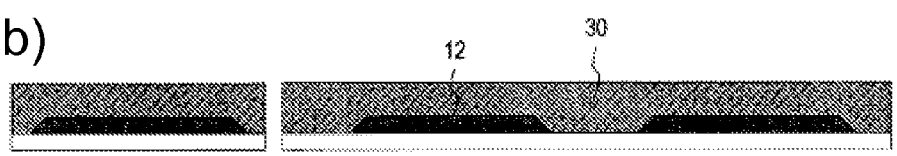
Figure 2:
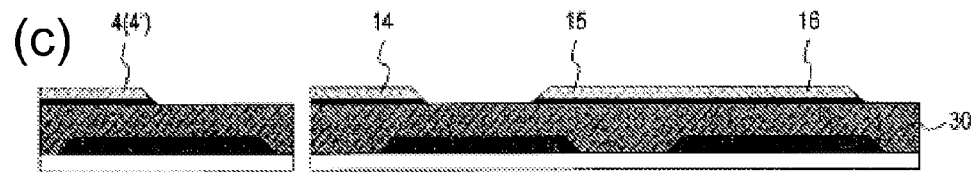
Figure 2:
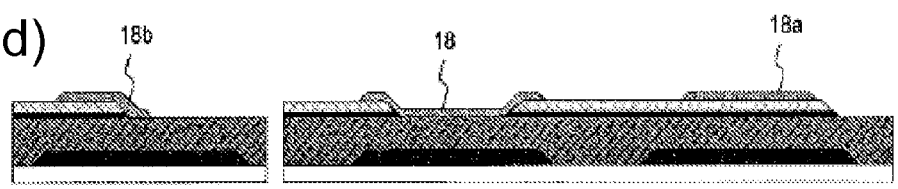
Figure 2:
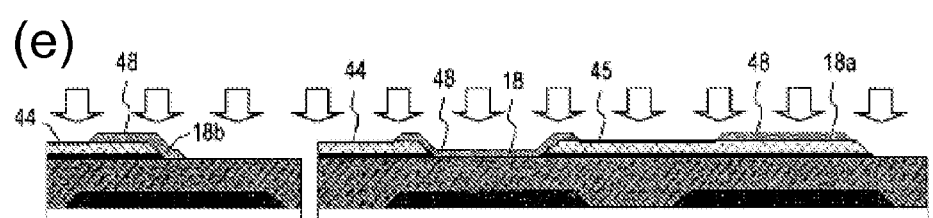
Figure 2:
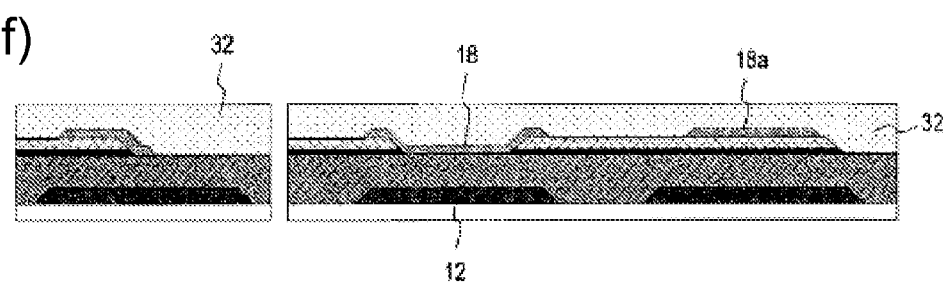
Figure 3:
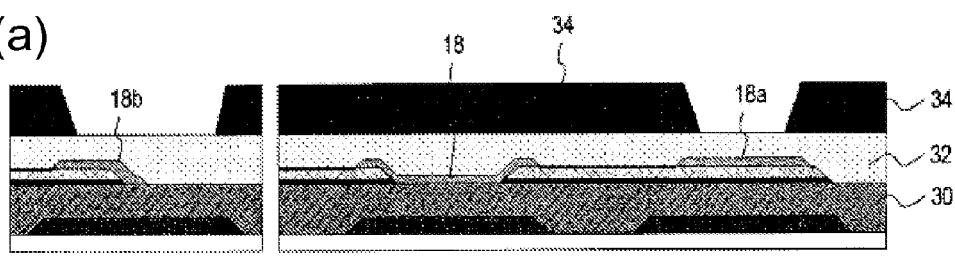
FIGS. 3(a) to 3(d) are cross-sectional views for explaining steps of manufacturing the TFT substrate 100, and are steps that follow the steps shown in FIGS. 2(a) to 2(f).
Figure 3:
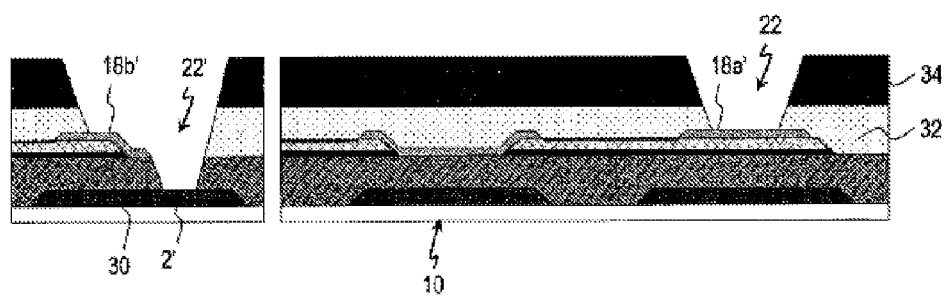
Figure 3:
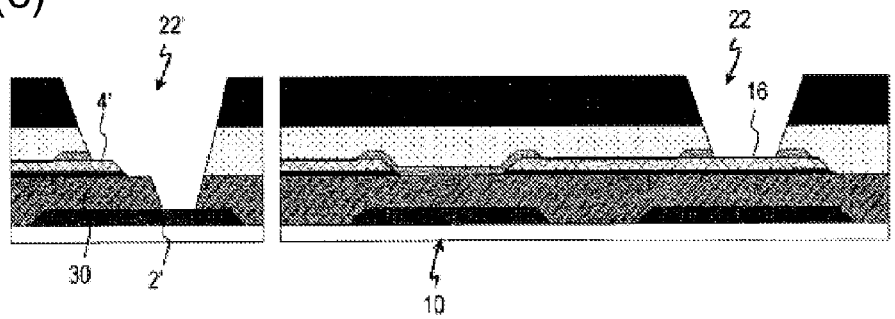
Figure 3:
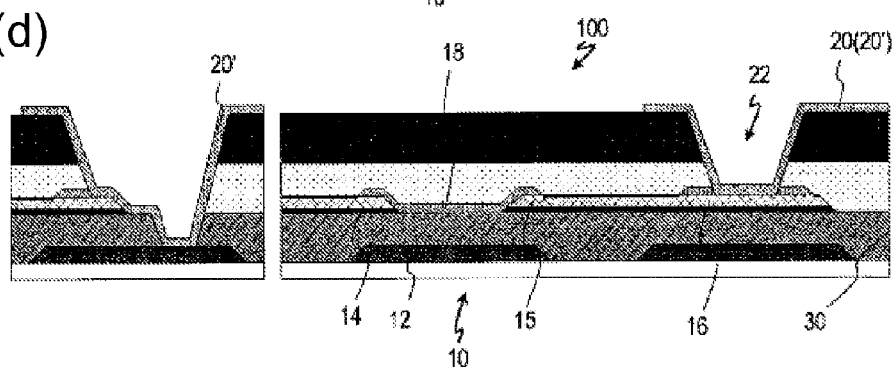

As shown in FIG. 1 and FIG. 3(d), the TFT substrate 100 of the present embodiment includes a thin-film transistor (an oxide semiconductor TFT) 10 having an active layer made of an oxide semiconductor. The TFT substrate 100 is used as an active matrix substrate in a liquid crystal display device. FIG. 1 shows a region substantially corresponding to a single pixel of the liquid crystal display device. In FIGS. 2 and 3, cross-sections of FIG. 1 along the line A-A' are shown on the right side of the drawing, and a connection region (hereinafter called a peripheral connection region R1) of a gate wiring line 2' and a source wiring line 4' is shown on the left side of the drawing.

As shown in FIG. 1, the TFT substrate 100 has gate bus lines 2 that extend in the horizontal direction, source bus lines 4 that extend in a direction intersecting with these gate bus lines 2 (typically in a direction perpendicular to the gate bus lines 2), and auxiliary capacitance bus lines 6 that extend between adjacent gate bus lines 2. An oxide semiconductor TFT 10 is provided in the vicinity of an intersection of the gate bus line 2 and source bus line 4.

The TFT 10 includes a gate electrode 12 integrally formed with the gate bus line 2, a source electrode 14 integrally formed with the source bus line 4, and a drain electrode 15 formed on the plane of the substrate opposing the source electrode 14 with a gap therebetween. The source electrode 14 and drain electrode 15 are arranged above a gate insulating film 30 (see FIGS. 2(b) and 2(c)) that covers the gate electrode 12.

The words "source" and "drain" for the TFT disclosed in the present specification are interchangeable, and a portion referred to as a "drain electrode" in the present specification can generally be called "a source electrode," for example.

An island-like semiconductor layer 18 made of an oxide semiconductor such as IGZO is provided between the source electrode 14 and drain electrode 15. This oxide semiconductor layer 18 is formed to cover respective edges of the source electrode 14 and drain electrode 15. In other words, the bottom of the oxide semiconductor layer 18 is in contact with the source electrode 14 and drain electrode 15, and the TFT 10 has the so-called bottom contact structure. The oxide semiconductor layer 18 forms a channel between the source/drain of the TFT 10, and the source electrode 14 and drain electrode 15 are electrically connected via this oxide semiconductor layer 18 when an ON voltage is applied to the gate electrode 12.

A drain connection part 16 is provided in the center of the pixel as an extension of the drain electrode 15. The drain connection part 16 is electrically connected to a pixel electrode 20 via a contact hole 22. In such a configuration, a voltage in accordance with a data signal from the source bus line 4 is applied to the pixel electrode 20 via the drain connection part 16 when the TFT 10 is ON.

In the present embodiment, the drain connection part 16 is arranged above the auxiliary capacitance bus line 6 with the gate insulating film 30 therebetween. An auxiliary capacitance is formed by the drain connection part 16, auxiliary capacitance bus line 6, and the insulating film 30 between these. To obtain a larger auxiliary capacitance, the drain connection part 16 may have a narrow rectangular shape that extends along the auxiliary capacitance bus line 6. If the drain connection part 16 (or the contact hole 22, described later) is provided above the auxiliary capacitance bus line 6, then regions with low contribution to display can be arranged together, and thus, the pixel aperture ratio will be improved.

Figure 7:
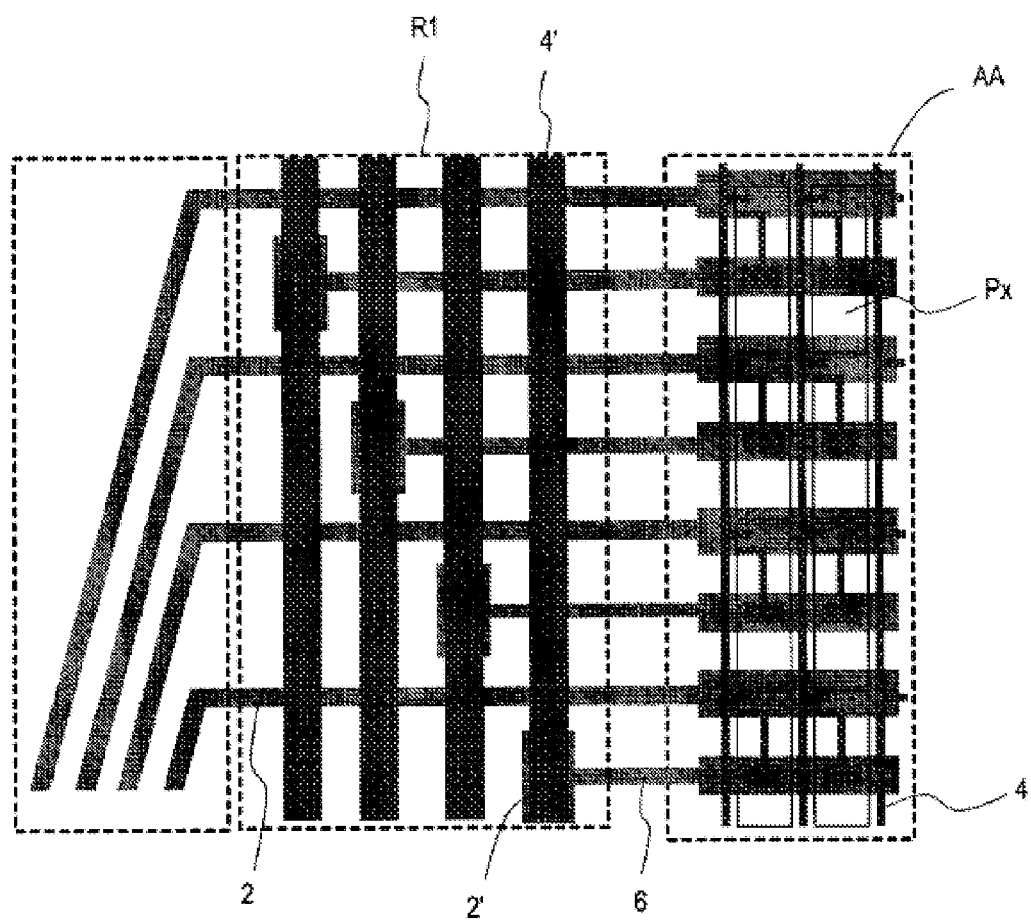
FIG. 7 is a plan view showing a connecting example between gate wiring lines and source wiring lines on a peripheral connection region.

A method of manufacturing the TFT substrate 100 used in the liquid crystal display device will be explained below with reference to FIGS. 2 and 3. As described above, cross-sections of FIG. 1 along the line A-A' are shown on the right side of the drawing. The peripheral connection region R1, which is a connection region between the gate wiring line 2' and source wiring line 4' (or source bus line 4), is shown on the left side of the drawings. As shown in FIG. 7, the peripheral connection region R1 is a region arranged on the outside of a region (active area AA) where pixels Px are arranged in an array, for example. Specific details will be described later.

As shown in FIG. 2(a), first, the gate bus line 2 (shown in FIG. 1), gate electrode 12, auxiliary capacitance bus line 6, and the like are formed on an insulating substrate 8 made of glass or the like. The gate wiring line 2' on the peripheral connection region R1 is formed at the same time. Specifically, these are formed as below, for example.

Sputtering or the like is used to form a conductive film by using a metal material such as titanium, molybdenum, chromium, tantalum, tungsten, copper, or aluminum, or an alloy material thereof. Next, the conductive film is etched using a mask that has been patterned by photolithography, thereby forming the gate bus line 2, gate electrode 12, auxiliary capacitance bus line 6, and the like. In the present specification, these are called the gate layer.

From the viewpoint of wiring resistance, it is preferable for the gate layer to be formed so as to have a laminated structure. An example of a laminated structure includes a structure in which, in order from the top layer, copper/titanium, copper/molybdenum, titanium/aluminum/titanium, molybdenum/aluminum/molybdenum or the like are laminated in that order. For improved adhesion and prevention of diffusion, a nitride film such as titanium nitride (TiN) or molybdenum nitride (MoN) may be used instead of the above-mentioned metal material.

Next, as shown in FIG. 2(b), the gate insulating film 30 is provided so as to cover the gate electrode 12 and the like. The gate insulating film 30 is made of a silicon oxide ($SiO_2$) film, a silicon nitride ($SiN_x$) film, a silicon oxynitride (SiON) film, or a lamination of these films, for example. Plasma-enhanced CVD or sputtering can be used to form the gate insulating film 30, for example.

Thereafter, as shown in FIG. 2(c), the source bus line 4 (or source wiring line 4'), source electrode 14, drain electrode 15, drain connection part 16, and the like are formed on the gate insulating film 30. These are sometimes collectively called the source/drain layer. Specifically, these are formed as below, for example.

Sputtering or the like is used to form a conductive film on the gate insulating film 30 by using a metal material such as titanium, molybdenum, chromium, tantalum, tungsten, copper, or aluminum, or an alloy material thereof. Next, the conductive film is etched using a mask that has been patterned by photolithography, thereby forming the source electrode 14, drain electrode 15 and drain connection part 16, source bus line 4, and the like.

From the viewpoint of wiring resistance, it is preferable for the source/drain layer to be formed so as to have a laminated structure. An example of a laminated structure includes a structure in which, in order from the top layer to the bottom layer, copper/titanium, copper/molybdenum, titanium/aluminum/titanium, molybdenum/aluminum/molybdenum or the like are laminated in that order. The above-mentioned metal material may be changed to a nitride film such as titanium nitride (TiN) or molybdenum nitride (MoN) for improved adhesion and prevention of diffusion.

Next, as shown in FIG. 2(d), the oxide semiconductor layer (channel portion) 18 that forms the channel of the TFT 10 is formed. The oxide semiconductor layer 18 is formed above the gate electrode 12 so as to cover the respective edges of the source electrode 14 and drain electrode 15 and to straddle these. In this way, the bottom-contact TFT 10 can be manufactured. The oxide semiconductor layer 18 can be specifically formed as below, for example.

The oxide semiconductor film is deposited by using an oxide semiconductor including In, Ga, and Zn as targets to perform DC discharge or AC discharge in an Ar gas and oxygen gas atmosphere. Next, the oxide semiconductor layer 18 is formed by etching the oxide semiconductor film using a resist mask that has been patterned by photolithography. The etching of the oxide semiconductor film can be performed by wet-etching with an organic acid such as oxalic acid or citric acid as the etching solution.

The oxide semiconductor layer 18 can be formed using materials other than the In—Ga—Zn—O semiconductor (IGZO) described above. A Zn—O semiconductor (ZnO), an In—Zn—O semiconductor (IZO), a Zn—Ti—O semiconductor (ZTO), or the like is suitably used, for example.

In the present embodiment, in addition to the oxide semiconductor layer 18 that forms the channel, additional oxide semiconductor layers (additional portions) 18a and 18b are formed so as to cover the drain connection part 16 and a portion of the source bus line 4 (or source wiring line 4') of the peripheral connection region R1. The oxide semiconductor layer 18a is formed above the drain connection part 16 in a region where the contact hole 22, described later, is to be provided. The oxide semiconductor layer 18b is formed in the peripheral connection region R1 so as to cover the source bus line 4 that will be connected to the gate wiring line 2' via a contact hole 22' described later. These additional oxide semiconductors 18a and 18b can be formed with ease by suitably configuring a mask pattern during etching of the oxide semiconductor film.

Next, as shown in FIG. 2(e), oxidation treatment is performed on the surfaces of the oxide semiconductor layers 18, 18a, and 18b that have been patterned as island-like regions.

This step of oxidizing can be performed by a plasma treatment, ozone treatment, and the like that uses $O_2$ gas or $N_2O$ gas. In order to not increase the number of steps, it is preferable to perform the step of oxidizing immediately prior to a step of film-forming in which a passivation film (protective film) 32 is formed, as described later. Specifically, if the protective film is deposited using CVD, then $N_2O$ plasma treatment may be performed, and if the protective film is deposited using sputtering, then $O_2$ plasma treatment may be performed. Alternatively, the oxidation treatment may be performed using $O_2$ plasma treatment with an ashing device.

Such an oxidation treatment increases the resistance of surfaces 48 of the oxide semiconductor layers 18, 18a, and 18b. In the channel portion 18 of the oxide semiconductor layer, a back channel portion acts as an oxygen excessive region, and resistance is increased. Thus, off-leakage current can be suppressed while the TFT 10 is OFF.

In the TFT 10 with the bottom-contact structure, the source/drain layer is already formed in the step (FIG. 2(c)) prior to the step of oxidizing (FIG. 2(e)). The oxidation treatment is performed with the source/drain layer exposed. Therefore, the surface of the source/drain layer is also oxidized, and metal oxide films 44 and 45 are formed on portions not covered by the oxide semiconductor layers 18, 18a, and 18b. These metal oxide films 44 and 45 are surface portions that have increased electric resistance due to oxidation. If copper wiring is used in the source/drain layer, then copper oxide (CuO) is formed on the surface thereof, and if aluminum wiring is used, then aluminum oxide ($Al_2O_3$) is formed, for example.

As shown by the drawing, however, the portion corresponding to the drain connection part 16 is covered by the additional oxide semiconductor layer 18a, and thus, the surface thereof is prevented from being oxidized. The peripheral connection region R1 also has the additional oxide semiconductor layer 18b provided thereon, and thus, the surface of the source bus line 4 is prevented from being oxidized.

Thereafter, as shown in FIG. 2(f), the passivation film 32 is formed so as to cover the oxide semiconductor layer, which includes the channel portion 18 and additional portions 18a and 18b.

The passivation film 32 can be formed in a similar step to the gate insulating film 30. The passivation film 32 may be a single layer or multilayer structure made of an oxide film (silicon oxide film, silicon oxynitride film, aluminum oxide film, aluminum oxynitride film, oxide titanium film) and a nitride film (silicon nitride film, silicon oxynitride film, aluminum nitride film, aluminum oxynitride film), and can be formed using plasma-enhanced CVD or reactive sputtering, for example.

The oxidation treatment described above may be performed using a device that forms the passivation film immediately prior to the passivation film being formed. As described above, when forming the passivation film with plasma-enhanced CVD, plasma treatment can be performed on the oxide semiconductor layer with dinitrogen monoxide gas as a main component prior to the passivation film forming.

Thereafter, as shown in FIG. 3(a), a planarizing film 34 is formed. The planarizing film 34 can be formed by patterning using photolithography with a photosensitive resin material. The planarizing film 34 formed by patterning can be used as a mask while forming the contact hole 22, as described later. The planarizing film 34 is provided for forming a pixel electrode layer above the planarized film, and the film thickness is approximately 2 to 3 μm, for example.

Thereafter, as shown in FIG. 3(b), the contact hole 22 is formed in the passivation film 32. Specifically, the passivation film 32 is etched using the patterned planarizing film 34 as a mask. The passivation film 32 and portions of the gate insulating film 30 not covered by the oxide semiconductor layer 18b are etched, and the contact hole 22' that reaches the gate wiring line 2' is formed on the peripheral connection region R1.

Dry-etching with plasma in which $O_2$ gas has been added to $CF_4$ gas may be performed to form the contact holes 22 and 22'. At this time, a sufficient etching selection ratio can be taken for the additional oxide semiconductor layers 18a and 18b and the passivation film 32 and gate insulating film 30, In other words, the oxide semiconductor layers 18a and 18b function as etching stoppers. Accordingly, the passivation film 32 is etched above the drain connection part 16 to form the contact hole 22, and at the same time both the passivation film 32 and the gate insulating film 30 can be etched in the peripheral connection region R1, and the contact hole 22' that exposes the gate wiring line 2' can be formed.

Thereafter, as shown in FIG. 3(c), oxide semiconductor layers 18a' and 18b' (shown in FIG. 3(b)) inside the contact holes 22 and 22' are removed. The oxide semiconductor layers 18a' and 18b' can be removed in a step of etching that is similar to the step of etching the oxide semiconductor layer described above (the step shown in FIG. 2(d)). In this way, the drain connection part 16 is exposed in the contact hole 22, and the source wiring line 4' is exposed in the contact hole 22'.

As shown in FIG. 3(d), a conductive layer (a pixel electrode layer 20') including the pixel electrode 20 is formed. It is preferable that a transparent and conductive metal oxide material be used for the pixel electrode 20. Specifically, indium tin oxide (ITO), indium zinc oxide (IZO), or the like can be used. The metal oxide film made of these materials can created by sputtering or the like, and this film can then be patterned using photolithography, and then etched to form the pixel electrode layer.

At this time the pixel electrode 20 electrically connects to the drain connection part 16, which has been exposed by removal of the additional portion 18a of the oxide semiconductor layer inside the contact hole 22.

According to the method described above, an increase in the resistance of the back channel portion can be achieved by forming the oxygen excessive region on the surface of the channel in the TFT 10 with the bottom-contact structure. Accordingly, OFF current can be reduced. Due to the bottom-contact structure, the channel of the TFT 10 is not damaged during the step of forming the source/drain layer (see FIG. 2(c)). Accordingly, it is possible to obtain a TFT with stable device characteristics.

There is a risk that, if the respective contacts are formed when the metal oxide has already been formed on the surface of the source/drain layer, then a schottky junction will be formed and a reduction in display quality will result due to contact resistance becoming higher. As a countermeasure, in the method of the present embodiment, the oxide semiconductor layer is formed after the source/drain layer has been formed; however, oxidation of the outermost surface of the source/drain electrode on the contact region (connection part) can be prevented in the step of oxidizing by providing additional oxide semiconductor layers, beforehand, on regions where contact can be taken. After oxidation treatment and prior to forming the pixel electrode layer, the surface of the source/drain layer that has not been oxidized is exposed by removing the oxide semiconductor layer provided on the contact region, and contact with this surface then becomes possible.

The connecting aspect between the drain connection part 16 and the pixel electrode 20 in the contact hole 22 will be explained in more detail below with reference to FIGS. 4(a) and 4(b).

Figure 4:
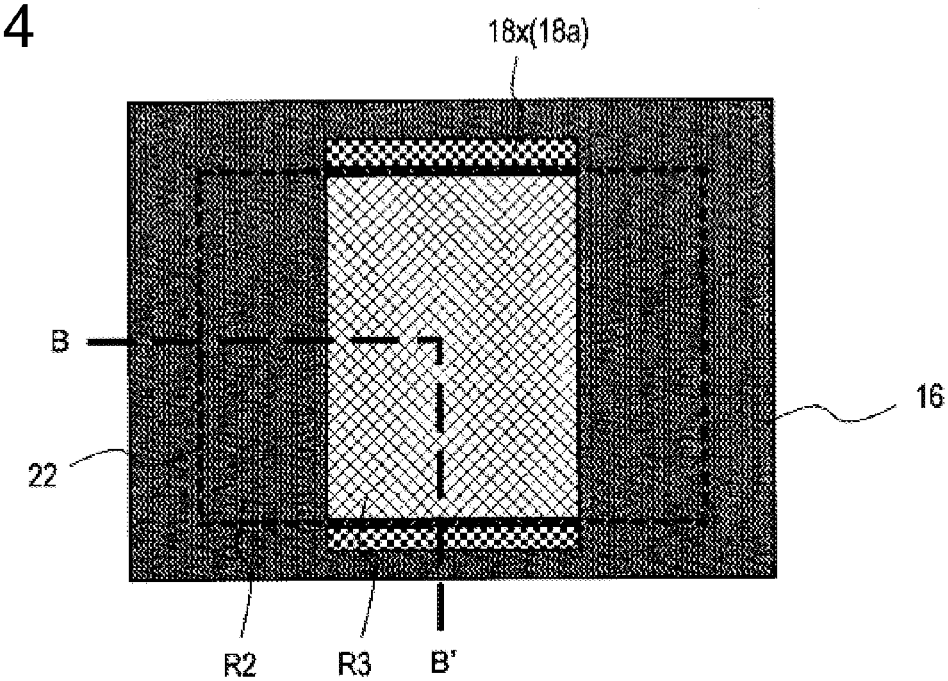
FIG. 4(a) is a plan view showing a magnified connecting part (contact hole forming part) of a drain electrode and pixel electrode.
FIG. 4(b) is a cross-sectional view along the line B-B' shown in 4(a).
Figure 4:
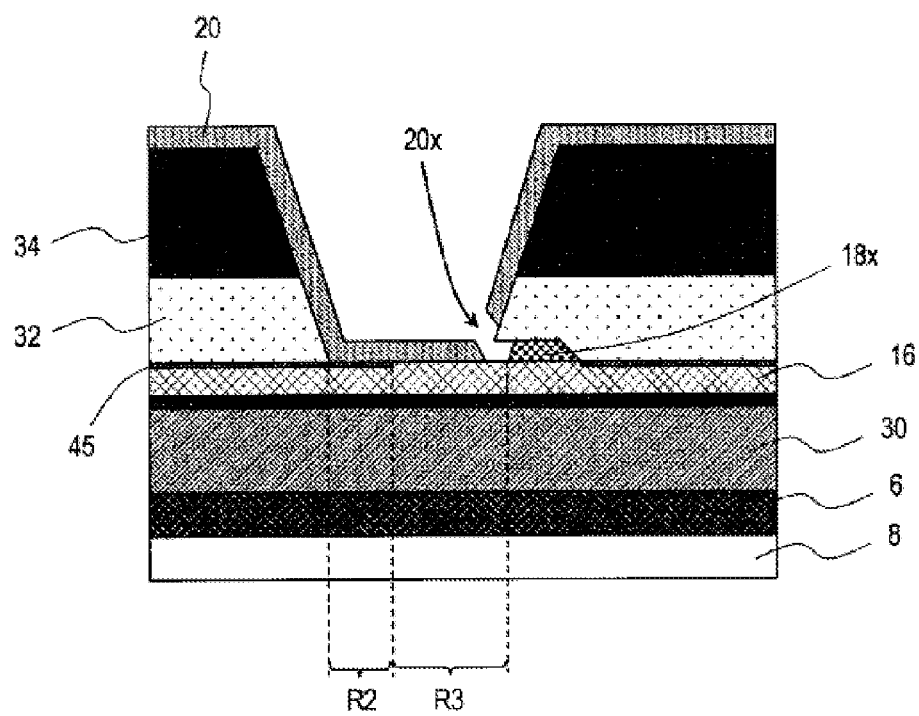

FIG. 4(a) is a magnified view showing the vicinity of the drain connection part 16 and contact hole 22. FIG. 4(b) is a cross-sectional view of FIG. 1 and FIG. 4(a) along the line B-B'.

In the present embodiment, the oxide semiconductor 18a that covers the drain connection part 16 is formed so as to be partially present on the bottom of the contact hole 22 formed in the following step. As a result, as shown in FIG. 4(a), a region R2 of the drain connection part 16 that has been oxidized (hereinafter, oxidized region R2) and a region R3 that has not been oxidized (hereinafter, non-oxidized region R3) are formed after the oxide semiconductor 18a' (see FIG. 3(b)) inside the contact hole 22 has been removed. The oxidized region R2 is a region that was not covered by the oxide semiconductor 18a, and the non-oxidized region R3 is a region that was covered by the oxide semiconductor 18a. The boundary of the oxidized region R2 and non-oxidized region R3 corresponds to an edge of the oxide semiconductor 18a. As such, a reason why at least a portion of the edge of the oxide semiconductor 18a is placed on the bottom of the contact hole 22 will be explained below.

If the oxide semiconductor 18a is formed so as to protrude from the bottom of the contact hole 22, then a remainder 18x will remain on the outside of the contact hole 22 after the step of removing the oxide semiconductor 18a'. However, if removing the oxide semiconductor 18a' through wet-etching as described above, then as shown in FIG. 4(b) the remainder 18x will remain while etching has progressed to the outside of the contact hole 22, due to wet-etching generally being isotropic.

In this way, when a depression is formed on the side of the contact hole 22 in the vicinity of the bottom, there is a risk that a stepped cut 20x of the electrode will occur, due to a level difference, during the step thereafter in which the pixel electrode 20 is formed by sputtering or the like. Accordingly, there is a risk that a connection anomaly will occur between the pixel electrode 20 and drain connection part 16.

As a countermeasure, by providing the region R2 without the oxide semiconductor layer 18a inside the contact hole 22, the above-mentioned difference in level will not occur at least at the boundary of the oxidized region R2 and non-oxidized region R3 in the bottom portion of the contact hole 22 after the step of removing the oxide semiconductor layer 18a. Accordingly, the connection between the pixel electrode 20 and drain connection part 16 can be prevented from being severed. In the oxidized region R2, the surface of the drain connection part 16 is oxidized, and thus, the contact resistance between the drain connection part 16 and pixel electrode 20 increases, but an improved connectivity is ensured due to a suitable contact being obtained in the non-oxidized region R3.

In order for a difference in level to not occur in the contact hole 22, and in order to not form a metal oxide film on the surface of the drain connection part 16, the edge of the bottom of the contact hole 22 and the edge of the oxide semiconductor layer 18a may be matched. In the actual manufacturing process, however, it is difficult to completely match these due to shifting in the position of the mask used for patterning, and the like. Therefore, in the present embodiment, a portion of the edge of the oxide semiconductor layer 18a is located in an inner edge of the contact hole 22, and a stepped cut of the pixel electrode 20 is prevented from occurring at this portion even if there are slight shifts in position.

Figure 5:
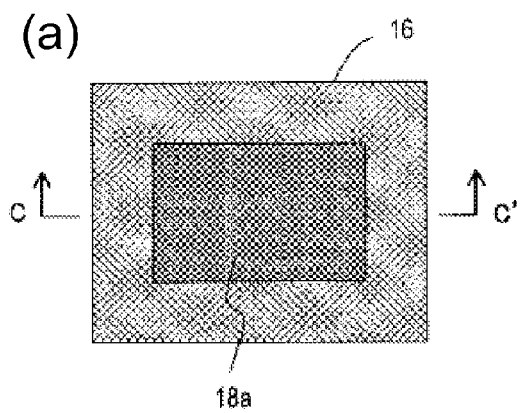
FIG. 5 is a view for explaining a manufacturing process of a modification example of the connecting part shown in FIG.
Figure 5:
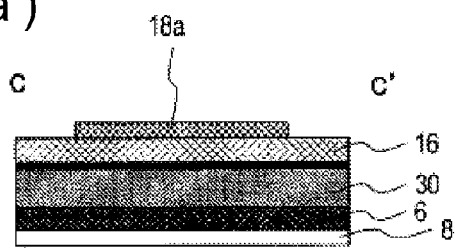
Figure 5:
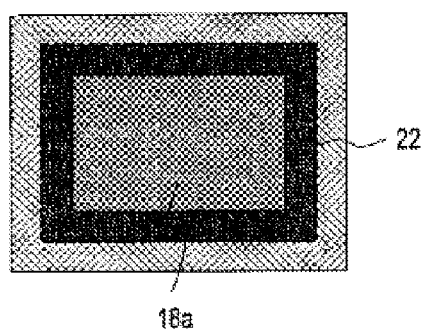
Figure 5:
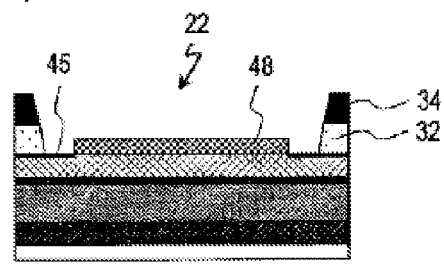
Figure 5:
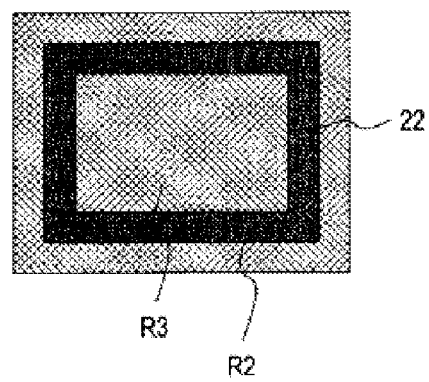
Figure 5:
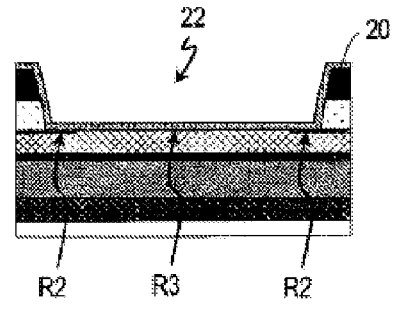

Next, a modification example of the connecting aspect between the pixel electrode 20 and the drain connection part 16 in the contact hole 22 described above will be explained with reference to FIG. 5. FIGS. 5(a) to 5(c) are plan views showing the formation process of the connecting aspect of the modification example. FIGS. 5(a') to 5(c') are cross-sectional views of FIGS. 5(a) to 5(c), respectively, along the line C-C'.

First, as shown in FIGS. 5(a) and 5(a'), an island-like additional oxide semiconductor layer 18a is formed above the drain connection part 16 in the step of forming the oxide semiconductor layer. Next, the surface of the oxide semiconductor layer is oxidized, but this also oxidizes the surface of the drain connection part 16 that is not covered by the oxide semiconductor layer 18a.

Thereafter, as shown in FIGS. 5(b) and 5(b'), the contact hole 22 is formed after forming the insulating films, such as the passivation film 32 and the planarizing film 34. At this time, as shown in the drawing, in the present modification example the entire outer edge of the oxide semiconductor layer 18a is located inside the bottom of the contact hole 22. Therefore, the oxide semiconductor layer 18a with the surface 48 that has been oxidized, and the metal oxide film 45 (portion of the drain connection part 16) that surrounds this surface 48 are exposed inside the contact hole 22.

Thereafter, as shown in FIGS. 5(c) to 5(c'), the pixel electrode 20 is formed after removing the oxide semiconductor layer 18a through wet-etching or the like. When the oxide semiconductor layer 18a has been removed, the non-oxidized region R3 of the drain connection part 16, which has not been oxidized, and the oxidized region R2 that surrounds this are exposed in the bottom of the contact hole 22. In this configuration, the pixel electrode 20 is suitably electrically connected to the drain connection part 16 at the non-oxidized region R3. The boundary (namely, the edge of the oxide semiconductor layer 18a) between the oxidized region R2 and non-oxidized region R3 is located in the bottom of the contact hole 22, but there is no level difference or the like formed in the contact hole 22. As a result, the pixel electrode 20 can be suitably connected to the drain connection part 16.

Figure 6:
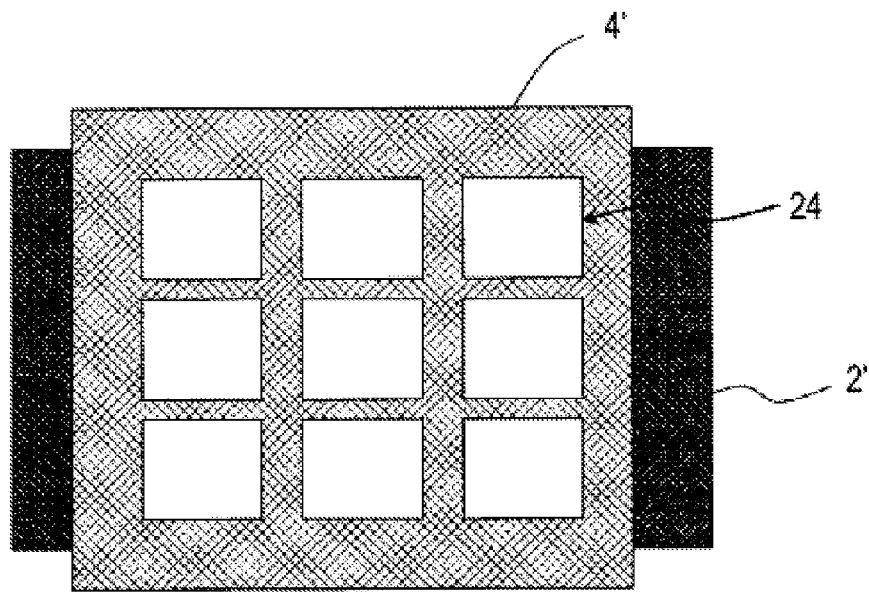
FIG. 6(a) is a plan view showing the connecting part of a gate wiring line and source wiring line.
FIG. 6(b) is a partially expanded view of 6(a).
Figure 6:
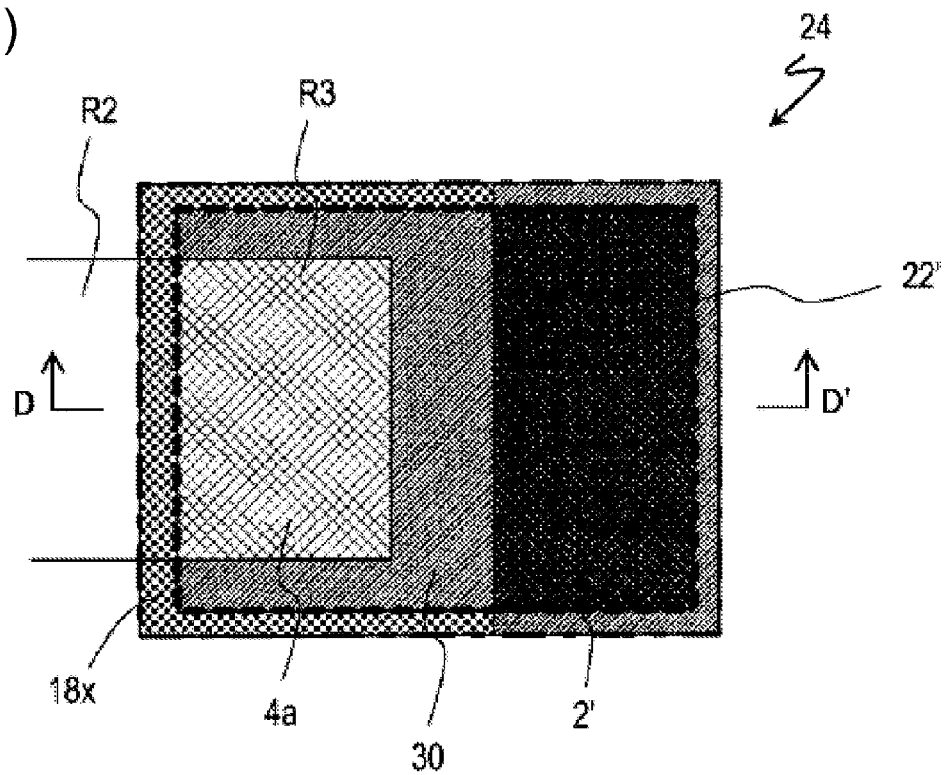

The peripheral connection region R1 will be explained below with reference to FIGS. 6 and 7.

The peripheral connection region R1 is a region that is located on the outside of a plurality of the pixels Px arranged in an array. This peripheral connection region R1 is provided with terminals, wiring lines, and the like for inputting source signals to the source bus line 4, for example.

When a source signal is inputted to the source bus line 4 from the driving circuit, a connection may be made with the source bus line 4 via the wiring lines and terminals (sometimes called the gate wiring lines 2') provided on a gate layer in the peripheral connection region R1. Thus, a connection is made between the gate wiring lines 2' and the source bus line 4 (or the source wiring lines 4') in the peripheral connection region R1.

If the oxide semiconductor TFT 10 is provided as in the present embodiment, a configuration may be adopted in which the driving circuit itself is integrally formed on the substrate using the oxide semiconductor layer. In this case, in the driving circuit the source wiring line 4' that is provided in the same layer as the source bus line 4 can be connected as desired to the gate wiring line 2' to form a desired circuit. A shift register including a gate driver can be formed, for example.

As shown in FIG. 7, in the peripheral connection region R1, the final end of the auxiliary capacitance bus line 6 (shown as the gate wiring line 2' here) may be connected to the source wiring line 4'. The source wiring line 4' is a wiring line that extends in the peripheral connection region R1 in parallel with the source bus line 4. In such a configuration, signals can be inputted to the auxiliary capacitance bus line 6 via the wiring line 4' that is provided in a different layer than the gate bus line 2 in order to achieve a narrower frame region (the region outside the active area AA).

Next, a specific example of the connecting aspect of the gate wiring line 2' and source wiring line 4' will be explained. FIG. 6(a) is a top view showing a contact portion 24 of the gate wiring line and source wiring line. As shown in the drawing, a plurality (9) of the contact portions 24 in the present embodiment are provided in order to obtain the connection between the gate wiring line 2' formed in the gate layer and the source wiring line 4' formed in the source/drain layer. FIG. 6(b) is a magnified view of one of the contact portions 24. The cross-sectional view of FIG. 6(b) along the line D-D' is shown as the peripheral connection region R1 on the right side in FIGS. 2 and 3.

Forming the contact portions 24 as shown in FIGS. 2 and 3 results in, as shown in FIG. 6(b), the remainder 18x of the island-like oxide semiconductor layer 18b that is provided so as to cover a connection part 4a of the source wiring line 4' and a portion of the gate insulating film 30 being present outside the contact hole 22'. The connection part 4a of the source wiring line 4', which is the non-oxidized region R3, and the portion of the gate insulating film 30 covered by the oxide semiconductor layer 18b are exposed inside the contact hole 22'. The gate wiring line 2' is exposed by the gate insulating film 30 being etched at the portion not covered by the oxide semiconductor layer 18b.

In such a configuration, in the step of forming the pixel electrode 20 as shown in FIG. 3(d), a conductive film is formed so as to connect the connection part 4a (the non-oxidized region R3) to the gate wiring line 2', thereby electrically connecting these, for example.

The embodiment of the present invention was described above, but without being limited thereto, various modifications can be made. When forming the contact between the pixel electrode 20 and the TFT 10 in the vicinity of the drain electrode 15, it is possible for the oxide semiconductor layer 18a that is provided inside the contact hole 22 (the drain connection part 16) to be integrally formed with the oxide semiconductor layer 18 of the channel portion, for example. In other words, in the aspect shown in FIG. 1, the drain connection part 16 is arranged in the center of the pixel extending from the drain electrode 15, but the drain connection part 16 may be integrally formed in the vicinity of the drain electrode 15. The oxide semiconductor layers 18 and 18a can cover these in a continuous fashion.

The TFT substrate manufactured as described above is used in a liquid crystal display device, for example. The liquid crystal display device is obtained by sandwiching a liquid crystal layer between the TFT substrate and an opposite substrate. It is also possible to use the TFT substrate to create an organic EL display device. In an organic EL display device, light-emitting elements are generally formed in each pixel. Each light-emitting element is provided with an organic EL layer, a TFT for switching, and a TFT for driving.

A memory device (an oxide semiconductor thin-film memory) can be also configured by arranging the TFTs in an array and using the TFTs as selection transistors.

INDUSTRIAL APPLICABILITY

The present invention is suitably used as an active matrix substrate that drives pixels in a display device, such as a liquid crystal display device. In particular, it is possible to achieve a mid to small high-performance liquid crystal panel by using the active matrix substrate of the present invention.

DESCRIPTION OF REFERENCE CHARACTERS 2 gate bus line
2' gate wiring line
4 source bus line
4' source wiring line
6 auxiliary capacitance bus line
10 TFT 12 gate electrode
14 source electrode
15 drain electrode
16 drain connection part
18 oxide semiconductor layer (channel portion)
18a, 18b oxide semiconductor layer (additional portion)
20 pixel electrode
22 contact hole
30 gate insulating film
32 passivation film
34 planarizing film
100 TFT substrate
R1 peripheral connection region
R2 oxidized region
R3 non-oxidized region

The invention claimed is:

1. A method of manufacturing a TFT substrate, comprising:
   preparing a substrate;
   forming a gate electrode and a gate insulating film that covers the gate electrode on the substrate;
   forming a source electrode and a drain electrode at a gap from each other on the gate insulating film such that the source electrode and the drain electrode face each other above the gate electrode, and forming a drain connection part that connects to the drain electrode;
   forming, after the step of forming the source electrode and the drain electrode, an oxide semiconductor layer that includes a channel portion connecting the source electrode to the drain electrode and that includes an additional portion covering the drain connection part;
   oxidizing a surface of the oxide semiconductor layer;
   forming an insulating film that covers the surface of the oxide semiconductor layer that has been oxidized;
   forming a contact hole in the insulating film at a region corresponding to the additional portion of the oxide semiconductor layer;
   removing a portion of the additional portion of the oxide semiconductor layer that is located inside the contact hole; and
   forming a conductive layer that electrically connects to the drain connection part via the contact hole, the drain connection part being exposed by removal of the additional portion.

2. The method of manufacturing a TFT substrate according to claim 1, further comprising:
   removing, after the step of oxidizing, a second additional portion that covers a source wiring line formed at the same time as the source electrode, the second additional portion being included in the oxide semiconductor layer; and
   forming a conductive film that electrically connects the source wiring line to the gate wiring line that is formed at the same time as the gate electrode, the source wiring line being exposed by removal of the second additional portion.

3. The method of manufacturing a TFT substrate according to claim 1,
   wherein, in the step of forming the contact hole, at least a portion of an edge of the additional portion of the oxide semiconductor layer is exposed in a bottom of the contact hole.

4. The method of manufacturing a TFT substrate according to claim 3,
   wherein, in the step of forming the contact hole, an entire outer edge of the additional portion of the oxide semiconductor layer is exposed in the bottom of the contact hole.

5. The method of manufacturing a TFT substrate according to claim 3,
   wherein both the drain connection part that is oxidized in the step of oxidizing and the drain connection part that is not oxidized in the step of oxidizing are exposed in the contact hole by the step of removing the portion of the additional portion of the oxide semiconductor layer that is located inside the contact hole.

6. A TFT substrate, comprising:
   a substrate;
   a gate electrode provided on the substrate;
   a gate insulating film that covers the gate electrode;
   a source electrode and a drain electrode provided at a gap from each other on the gate insulating film such that the source electrode and the drain electrode face each other above the gate electrode;
   an oxide semiconductor layer that is provided so as to cover the gap between the source electrode and the drain electrode and that has a bottom that connects to the source electrode and the drain electrode, a surface of the oxide semiconductor layer being oxidized;
   a drain connection part connected to the drain electrode;
   an insulating film arranged above the drain connection part, the insulting film having a contact hole; and
   a conductive layer connected to the drain connection part via the contact hole,
   wherein a surface in contact with the conductive layer of the drain connection part has an oxidized region and non-oxidized region inside the contact hole.

7. The TFT substrate according to claim 6,
   wherein an additional portion of the oxide semiconductor layer having the surface that is oxidized is formed so as to cover the drain connection part around the contact hole.

8. The TFT substrate according to claim 6,
   wherein the oxidized region is formed so as to surround the non-oxidized region in the contact hole.

9. A method of manufacturing a TFT substrate, comprising:
   preparing a substrate;
   forming a gate electrode and a gate insulating film that covers the gate electrode on the substrate;
   forming a source electrode and a drain electrode at a gap from each other on the gate insulating film such that the source electrode and the drain electrode face each other above the gate electrode;
   forming, in the step of forming the source electrode and drain electrode, and at the same time, a first conductive layer at a location that is different from the source electrode and the drain electrode;
   forming, after the step of forming the source electrode and the drain electrode, an oxide semiconductor layer that includes a channel portion connecting the source electrode to the drain electrode and that includes an additional portion covering the first conductive layer;
   oxidizing a surface of the oxide semiconductor layer;
   removing at least a portion of the oxide semiconductor layer on the additional portion of the oxide semiconductor layer; and
   forming a second conductive film in contact with the first conductive film, the first conductive film being exposed by removal of the oxide semiconductor layer of the additional portion.

* * * * *